United States Patent
Nobuhara et al.

(10) Patent No.: US 6,882,902 B2
(45) Date of Patent: Apr. 19, 2005

(54) METHOD OF AND APPARATUS FOR THERMAL ANALYSIS, METHOD OF AND APPARATUS FOR CALCULATING THERMAL CONDITIONS, COMPUTER PRODUCT

(75) Inventors: Yuriko Nobuhara, Tokyo (JP); Naoki Kimura, Tokyo (JP); Yoshio Nakamura, Tokyo (JP); Satoru Isogai, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 631 days.

(21) Appl. No.: 09/916,584

(22) Filed: Jul. 30, 2001

(65) Prior Publication Data

US 2002/0139792 A1 Oct. 3, 2002

(30) Foreign Application Priority Data

Feb. 2, 2001 (JP) ........................................ 2001-027093

(51) Int. Cl.$^7$ ............................................... G05D 23/00
(52) U.S. Cl. ....................... 700/275; 700/276; 700/299; 219/494; 219/497
(58) Field of Search ................................ 700/278, 276, 700/299; 219/494, 497

(56) References Cited

U.S. PATENT DOCUMENTS 6,382,497 B1 * 5/2002 Nagafuku et al. .......... 228/103
6,501,051 B1 * 12/2002 Richert et al. .............. 219/388

FOREIGN PATENT DOCUMENTS

| JP | 3-50790 A | 3/1991 |
| JP | 11-201647 A | 7/1999 |

* cited by examiner

*Primary Examiner*—Leo Picard
*Assistant Examiner*—Carlos R. Ortiz Rodriguez
(74) *Attorney, Agent, or Firm*—Oblon, Spivak, McClelland, Maier & Neustadt, P.C.

(57) ABSTRACT

The physical property data of the object to be heated, set temperatures of heaters and blowers are provided to a reflow apparatus, and view factor setting data for determining the view factor of the surface-mounted circuit board are input. From the input these data, the number of heaters and blowers, and the heating characteristic data peculiar to the reflow apparatus, such as the heat transfer coefficient, the speed of conveyor and the like, the view factor is simply determined, and the temperature of the surface-mounted circuit board at the time of passing through the reflow apparatus is calculated with respect to the board and parts mounted thereon, using the determined view factor.

18 Claims, 11 Drawing Sheets

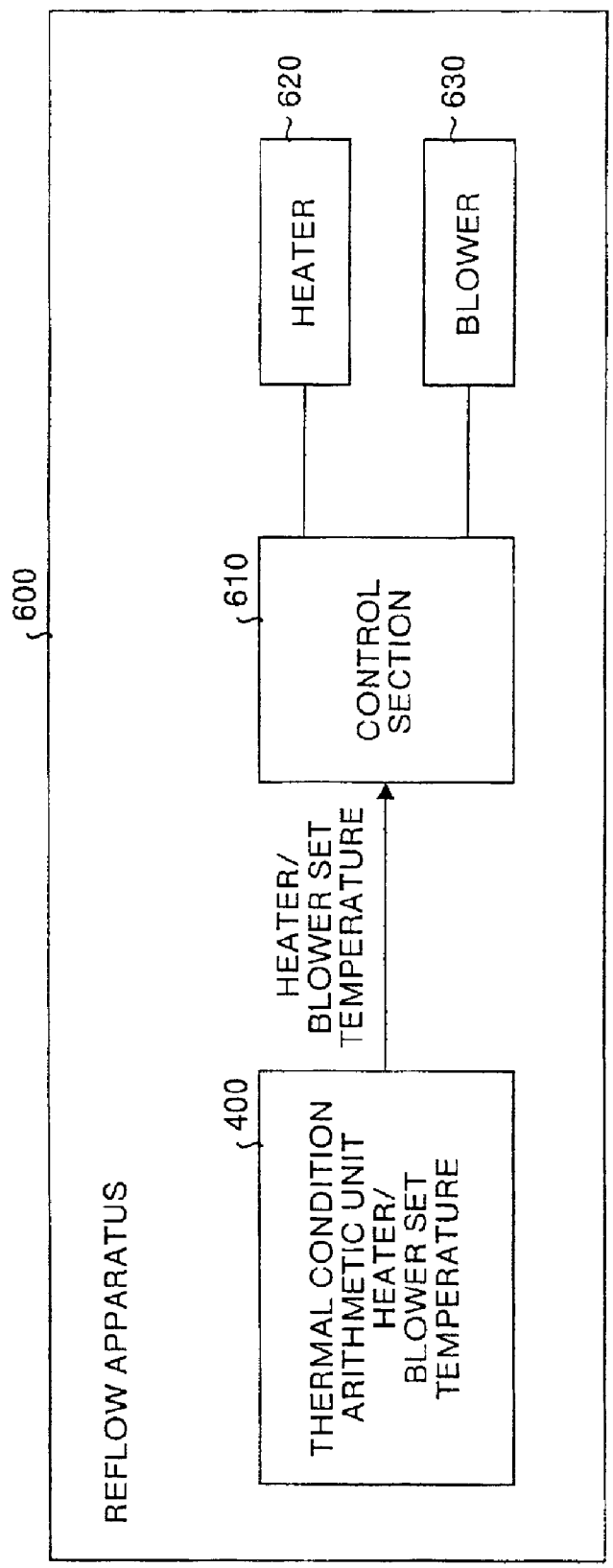

Background Art

METHOD OF AND APPARATUS FOR THERMAL ANALYSIS, METHOD OF AND APPARATUS FOR CALCULATING THERMAL CONDITIONS, COMPUTER PRODUCT

FIELD OF THE INVENTION

The present invention relates to a method of and apparatus for thermal analysis, a method of and apparatus for calculating thermal conditions, and a computer program which when executed on a computer realizes the methods according to the present invention.

BACKGROUND OF THE INVENTION

In order to satisfy the demand for the electronic devices to be small sized and consume less power, IC chips that are the main component of the electronic devices are becoming smaller and smaller. Currently, the size of the actually distributed IC chips (bare chips) satisfies well such demands. However, the size of the electronic devices is decided by the size of a package wrapping the IC chip, rather than the size of the IC chip itself.

On the other hand, for the semiconductor manufacturers, it is preferred, in view of easy handling in the test process and enabling cost reduction, to supply the semiconductor devices in the form of a mold-sealed package by pulling a lead of the chip, rather than supplying semiconductor devices in the form of a bare chip or a flip chip.

Under such a background, as the IC chips, a surface mounting type package with the packaging density increased in the height direction is becoming particularly predominant, and is provided in various forms such as SOP (Small Outline Package), QFP (Quad Flat Package) and BGA (Ball Grid Array).

With the introduction of various surface mounting type electronic parts including such IC chips, miniaturization and high integration of the electronic circuit board are planned, thereby increasing the number of parts arranged on the same circuit board. Normally, mounting of these electronic parts on the printed circuit board, that is, electric connection between a predetermined electrode pad portion on the printed circuit board and the electronic parts is realized by so-called reflow soldering processing.

The reflow soldering processing is achieved by a series of flow comprising: a solder printing step of printing a cream solder on an electrode pad portion which performs electric connection with the electronic parts; a mounting step of mounting the electronic parts so that an electrode pin or bump is located on the printed solder; and a reflow step of performing electric connection between the electronic parts and the printed circuit by melting and fixing the printed solder, on the printed circuit board having a predetermined circuit pattern formed thereon.

The solder printing step, mounting step and the reflow step are respectively performed by a printer, a mounter and a reflow apparatus, and these apparatus have a conveyor, to thereby carry the printed circuit board processed by own apparatus out to the apparatus on the subsequent stage. Among these apparatus, particularly, the reflow apparatus needs to heat the printed circuit board and the electronic parts in order to melt the solder, and hence its main function is to control the heating.

FIG. 11A and FIG. 11B are diagrams that explain the construction of a conventional reflow apparatus and the temperature profile. As shown in FIG. 11A, the reflow apparatus sequentially carries a surface-mounted circuit board 700 to a preheating chamber, a main heating chamber and a cooling chamber by a conveyor 701, to thereby perform reflow soldering with respect to the surface-mounted circuit board 700. The surface-mounted circuit board 700 stands for a printed circuit board in the state of having various electronic parts mounted thereon by the mounter, after having been solder printed by the printer.

At first, the surface-mounted circuit board 700 carried to the preheating chamber is subjected to soaking only by a hot air blower 702, after having heated the surface-mounted circuit board 700 by using a heater 703 and the hot air blower 702. During this preheating, the board portion of the surface-mounted circuit board 700 reaches the soaking temperature as shown by a solid line 801 and the parts on the surface-mounted circuit board 700 reaches the soaking temperature as shown by a dotted line 802 in FIG. 11B.

Subsequently, the surface-mounted circuit board 700 carried to the main heating chamber is subjected to soaking only by the hot air blower 702, after having heated the surface-mounted circuit board 700 to a high temperature by using the heater 703 and the hot air blower 702. During this main heating, the board portion and the parts of the surface-mounted circuit board 700 respectively reach the soaking temperature as shown by the solid line 801 and the dotted line 802 in FIG. 11B. Thereby, the solder printed on the surface-mounted circuit board 700 melts, to thereby join the parts and the printed circuit. Then, the surface-mounted circuit board 700 is cooled in the cooling chamber, to thereby fix the melt solder, and as a result, the electric connection between the parts and the printed circuit is obtained.

As described above, with the reflow apparatus, in order to perform temperature control in accordance with the temperature profile as shown in FIG. 11B, that is, to accurately perform temperature control, it is necessary to accurately determine the speed of the conveyor 701, the heating temperature of the heater 703, and heating conditions such as the hot air temperature of the hot air blower. The heating conditions include heating characteristic data peculiar to the reflow apparatus, and data regarding the surface-mounted circuit board 700 involving the kind, the size and the physical property of the board, the kind, the size and the physical property of the parts mounted on the board.

However, since the setting operation of these heating conditions is complicated and time-consuming, the actual temperature control by the reflow apparatus has been heretofore performed, in many cases, by repeating operations of first setting heating conditions under which an object to be heated is assumed to reach a desired temperature with respect to the reflow apparatus by an operator, based on his experience and intuition, and adjusting again the heating conditions from the results obtained by the setting (hereinafter referred to a "first method").

Moreover, as another method, there is a method in which the heating characteristic data of the reflow apparatus, and the size and the physical property data of an object to be heated are input to the reflow apparatus and other apparatus to calculate the heating conditions under which the temperature of the object reaches to a desired temperature, and the heating conditions are set to the reflow apparatus (hereinafter referred to a "second method").

In the first method, however, since skill and experience are required for setting the heating conditions, only an expert can realize this method. With the second method, since an optimum setting value is calculated from the heating characteristic data of the reflow apparatus input beforehand and the characteristic data of the object, the operator need not be an expert. However, if more accurate calculation is to be performed, much data of the object is required, and not only the input work becomes complicated, but also much time is required for that calculation. Therefore, it is not possible to quickly shift to the actual reflow soldering step, and hence it is not practical to incorporate this method in the actual operation.

Furthermore, the current eutectic solder is an alloy containing lead in about 37% or more, and the existence of lead becomes a big problem in dumping and recycling the electronic parts. Under this situation, there is a desire to use lead-free solder. However, since the lead-free solder has a higher melting temperature than the eutectic solder, it is necessary to increase the temperature for heating the surface-mounted circuit board in the reflow apparatus, causing a problem in that the temperature control must be performed more accurately so as not to exceed the heat resistant temperature of the parts.

SUMMARY OF THE INVENTION

It is an object of the present invention to provide a technology with which it is possible to derive optimum heating conditions accurately and quickly by simply introducing a view factor of an object to be heated, at the time of determination of heating conditions provided to the heating apparatus such as a reflow apparatus.

The thermal analyzer according to one aspect of the present invention is an apparatus for predicting a temperature of an object to be heated, when a heating furnace heats the object based on predetermined heating conditions. This thermal analyzer comprises an input unit for inputting at least the heating conditions, the physical property data of the object and the view factor setting data of the object; a view factor calculation unit which calculates a view factor corresponding to a position of the object with respect to heating sources, based on the heating characteristic data of the heating furnace including data regarding at least the number and arrangement of the heating sources of the heating furnace, and the view factor setting data; and a temperature calculation unit which calculates the temperature of the object, based on the heating conditions, the physical property of the object, the heating characteristic data of the heating furnace and the view factor.

The thermal conditions calculator according to another aspect of the present invention is an apparatus for deriving predetermined heating conditions so that the temperature of an object to be heated satisfies desired conditions when a heating furnace heats the object based on the predetermined heating conditions. This thermal conditions calculator comprises an input unit for inputting the desired conditions of heating characteristic data, heating characteristic data of the object and an evaluation function; a temperature calculation unit which calculates the temperature of the object, based on the heating characteristic data and the heating characteristic data of the object; and a judgment unit which judges whether the evaluation function satisfies predetermined conditions or not, with respect to the temperature calculated by the temperature calculation unit. If it is judged that the evaluation function does not satisfy the predetermined conditions then the heating conditions are changed. If it is judged that the evaluation function satisfies the predetermined conditions then the heating conditions set at the time of calculating the temperature are output. When the heating conditions are changed by the judgment unit, the temperature calculation unit calculates the temperature of the object again, based on the changed heating conditions.

The thermal conditions calculator according to still another aspect of the present invention is an apparatus for deriving predetermined heating conditions so that the temperature of an object to be heated comprising a plurality of constituents satisfies desired conditions when a heating furnace heats the object based on the predetermined heating conditions. The thermal conditions calculator comprises an input unit for inputting at least an evaluation function that satisfies conditions when a temperature difference between the plurality of constituents becomes a predetermined value or below, the heating conditions and the physical property data of the object; a temperature calculation unit which calculates the temperature of the object, based on the heating characteristic data of the heating furnace including data regarding at least the number and arrangement of heating sources of the heating furnace, the heating conditions and the physical property of the object; and a judgment unit which judges whether the temperature calculated by the temperature calculation unit satisfies the evaluation function or not. If it is judged that the temperature does not satisfy the evaluation function then the heating conditions are changed. If it is judged that the temperature satisfies the evaluation function then the heating conditions set at the time of calculating the temperature are output. When the heating conditions are changed by the judgment unit, the temperature calculation unit calculates the temperature of the object again, based on the changed heating conditions.

The thermal conditions calculator according to still another aspect of the present invention is an apparatus for deriving predetermined heating conditions so that the temperature of an object to be heated satisfies desired conditions when a heating furnace heats the object based on the predetermined heating conditions. This thermal conditions calculator comprises an input unit for inputting at least an evaluation function that satisfies conditions when the temperature of the object becomes a predetermined allowable temperature or below, the heating conditions and the physical property data of the object; a temperature calculation unit which calculates the temperature of the object, based on the heating characteristic data of the heating furnace including data regarding at least the number and arrangement of heating sources of the heating furnace, the heating conditions and the physical property of the object; and a judgment unit which judges whether the temperature calculated by the temperature calculation unit satisfies the evaluation function or not. If it is judged that the temperature does not satisfy the evaluation function then the heating conditions are changed. If it is judged that the temperature satisfies the evaluation function then the heating conditions set at the time of calculating the temperature are output. When the heating conditions are changed by the judgment unit, the temperature calculation unit calculates the temperature of the object again, based on the changed heating conditions.

The method of thermal analysis method according to still another aspect of the present invention is a method of predicting a temperature of an object to be heated, when a heating furnace heats the object based on predetermined heating conditions. This method includes the steps of inputting at least the heating conditions, the physical property data of the object and the view factor setting data of the object; calculating a view factor corresponding to a position of the object with respect to heating sources, based on the heating characteristic data of the heating furnace including data regarding at least the number and arrangement of the heating sources of the heating furnace, and the view factor setting data; and calculating the temperature of the object, based on the heating conditions, the physical property of the object, the heating characteristic data of the heating furnace and the view factor.

The method of calculating thermal conditions according to still another aspect of the present invention is a method of deriving predetermined heating conditions so that the temperature of an object to be heated satisfies desired conditions when a heating furnace heats the object based on the predetermined heating conditions. The method includes the steps of inputting at least an evaluation function indicating the desired conditions, the heating conditions, the physical property data of the object and the view factor setting data of the object; calculating a view factor corresponding to a position of the object with respect to heating sources, based on the heating characteristic data of the heating furnace including data regarding at least the number and arrangement of the heating sources of the heating furnace, and the view factor setting data; calculating the temperature of the object, based on the heating conditions, the physical property of the object, the heating characteristic data of the heating furnace and the view factor; and judging whether the calculated temperature satisfies the evaluation function or not. If it is judged that the temperature does not satisfy the evaluation function then the heating conditions are changed. If it is judged that the temperature satisfies the evaluation function then the heating conditions set at the time of calculating the temperature are output. When the heating conditions are changed, the calculation of temperature are the judgment whether the calculated temperature satisfies the evaluation function or not are repeated again based on the changed heating conditions.

The method of calculating thermal conditions according to still another aspect of the present invention is a method of deriving predetermined heating conditions so that the temperature of an object to be heated comprising a plurality of constituents satisfies desired conditions when a heating furnace heats the object based on the predetermined heating conditions. This method includes the steps of inputting at least an evaluation function that satisfies conditions when a temperature difference between the plurality of constituents becomes a predetermined value or below, the heating conditions and the physical property data of the object; calculating the temperature of the object, based on heating characteristic data of the heating furnace including data regarding at least the number and arrangement of heating sources of the heating furnace, the heating conditions and the physical property of the object; and judging whether the calculated temperature satisfies the evaluation function or not. If it is judged that the temperature does not satisfy the evaluation function the heating conditions are changed. If it is judged that the temperature satisfies the evaluation function the heating conditions set at the time of calculating the temperature are output. When the heating conditions are changed, the calculation of temperature are the judgment whether the calculated temperature satisfies the evaluation function or not are repeated again based on the changed heating conditions.

The method of calculating thermal conditions according to still another aspect of the present invention is a method of deriving predetermined heating conditions so that the temperature of an object to be heated satisfies desired conditions when a heating furnace heats the object based on the predetermined heating conditions. This method includes the steps of inputting at least an evaluation function that satisfies conditions when the temperature of the object becomes a predetermined allowable temperature or below, the heating conditions and the physical property data of the object; calculating the temperature of the object, based on the heating characteristic data of the heating furnace including data regarding at least the number and arrangement of heating sources of the heating furnace, the heating conditions and the physical property of the object; and judging whether the temperature calculated in the temperature calculation step satisfies the evaluation function or not. If it is judged that the temperature does not satisfy the evaluation function the heating conditions are changed. If it is judged that the temperature satisfies the evaluation function the heating conditions set at the time of calculating the temperature are output. When the heating conditions are changed, the calculation of temperature are the judgment whether the calculated temperature satisfies the evaluation function or not are repeated again based on the changed heating conditions.

Other objects and features of this invention will become apparent from the following description with reference to the accompanying drawings.

BRIEF DESCRIPTION OF THE DRAWINGS

FIG. 10 is a block diagram showing a schematic construction of a reflow apparatus incorporating the thermal conditions calculator according to the second embodiment.

DESCRIPTION OF THE PREFERRED EMBODIMENTS

Embodiments of the method of and apparatus for thermal analysis, method of and apparatus for calculating thermal conditions, and the computer program which when executed on a computer realizes the methods according to the present invention will now be described while referring to the accompanying drawings. However, the present invention is not limited by these embodiments. Particularly, in these embodiments, description is made of a case where a surface-mounted circuit board is the object to be heated, and a heating apparatus for heating the surface-mounted circuit board is a reflow apparatus.

The method of and apparatus for thermal analysis according to the first embodiment will now be described. This method and apparatus are characterized by inputting the physical property data regarding a surface-mounted circuit board serving as an object to be heated, set temperatures of heaters and blowers, serving as heating conditions provided to a reflow apparatus, and view factor setting data for determining a view factor of the surface-mounted circuit board, simply determining a view factor from these input data and the number of heaters and blowers, and heating characteristic data peculiar to the reflow apparatus involving the heat transfer coefficient thereof and the speed of the conveyor, and calculating the temperature of the surface-mounted circuit board at the time of passing through the reflow apparatus, using the determined view factor, with respect to the board and the parts mounted thereon, respectively.

Figure 1:
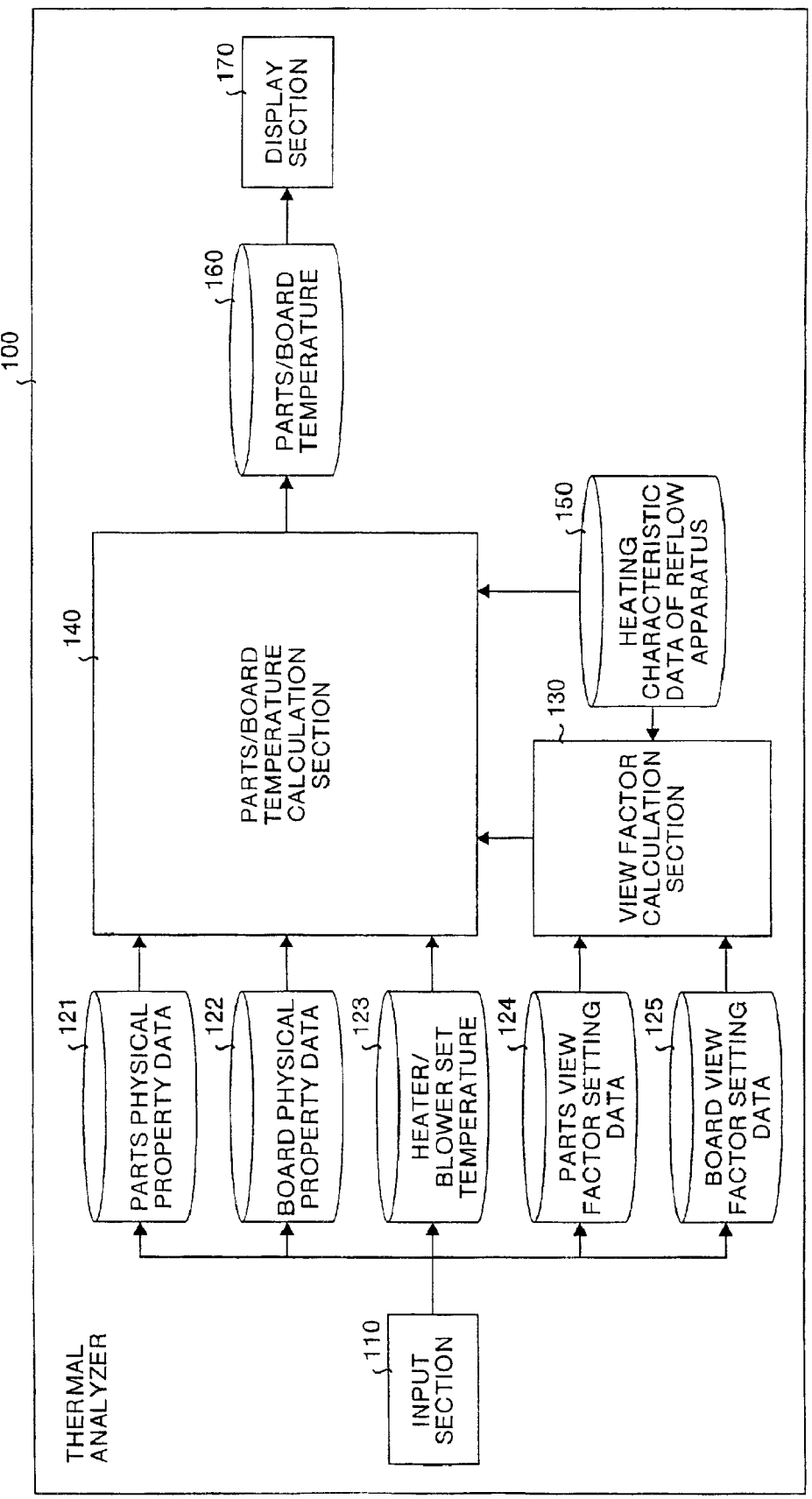
FIG. 1 is a block diagram showing a schematic construction of a thermal analyzer according to a first embodiment.

FIG. 1 is a block diagram showing a schematic construction of the thermal analyzer according to the first embodiment. This thermal analyzer 100 includes the input section 110 for inputting various data; a memory section for storing, respectively, the parts physical property data 121, board physical property data 122, heater/blower set temperatures 123, parts view factor setting data 124, and board view factor setting data 125, input using the input section 110. The thermal analyzer 100 also includes a memory section for storing the heating characteristic data 150 of the reflow apparatus; a view factor calculation section 130 for calculating a view factor used for the calculation of parts/board temperatures, based on the parts view factor setting data 124, board view factor setting data 125, and the heating characteristic data 150 of the reflow apparatus. The thermal analyzer 100 also includes the parts/board temperature calculation section 140 for calculating the parts/board temperature; a memory section for storing the parts/board temperature 160, being the calculation results of the parts/board temperature calculation section 140; and a display section 170 for displaying the input various data and the calculation results of the parts/board temperature calculation section 140.

Particularly in this embodiment, the calculation of the temperature T (t) of the parts or the board in the parts/board temperature calculation section 140 is to be performed by solving a differential equation shown in the equation (1) described below by means of a numerical analysis using the biquadratic Runge-Kutta method.

$$\frac{dT}{dt} = k_1 \cdot (Th^4 - T(t)^4) + k_2 \cdot (Tg - T(t)) \quad (1)$$

$$\text{where } k_1 = \frac{\sigma \cdot \varepsilon_1 \cdot \varepsilon_2 \cdot F_{12} \cdot S}{C} \text{ and } k_2 = \frac{\alpha \cdot S}{C}$$

The parameters in the equation (1) are Th:heater temperature, Tg:blower temperature, σ:Boltzmann's constant, $\varepsilon_1$:emissivity of the heater, $\varepsilon_2$:emissivity of an object to be heated, $F_{12}$:view factor of the object to be heated with respect to the heater, S:surface area of the object to be heated, C:heat capacity of the object to be heated, and α:heat transfer coefficient of the blower.

The biquadratic Runge-Kutta method is a standard numerical analysis method of an ordinary differential equation. Specifically, when y'=f(x, y), $y(x_0)=y_0$ is given, this numerical analysis method obtains a solution by calculating in order as in the equation (2) described below:

$$y_{i+1} = y_i + \frac{a_1 + 2a_2 + 2a_3 + a_4}{6} \quad (2)$$

where $a_1 = h \cdot f(x_i, y_i)$ $$a_2 = h \cdot f\left(x_i + \frac{h}{2}, y_i + \frac{a_1}{2}\right)$$

$$a_3 = h \cdot f\left(x_i + \frac{h}{2}, y_i + \frac{a_2}{2}\right)$$

$a_4 = h \cdot f(x_i + h, y_i + a_3)$

Here, h is a division width $(x_{i+1}-x_i)$. This equation has a cut-off error of an order of $h^4$ in Talor expansion.

Here, by assuming equation (1)=f(t, T(t)) to apply the equation (2), the temperature T(t) of the board or the parts at time t can be predicted. Therefore, if the emissivity and set temperature of the heater and the heat transfer coefficient and set temperature of the blower are common parameters, then, in order to calculate a temperature of a specific part on a surface-mounted circuit board, the emissivity of the part, the surface area of the part, the heat capacity of the part and the view factor of the part with respect to the heater are required. Therefore, in order to calculate the temperature of the board of the surface-mounted circuit board, the emissivity of the board, the surface area of the board, the heat capacity of the board and the view factor of the board with respect to the heater are required.

The set temperature of the heater and the set temperature of the blower correspond to the above-described heater/blower set temperatures 123, the emissivity of a specific part, the surface area of the part and the heat capacity of the part correspond to the data constituting the above-described parts physical property data 121, and the emissivity of the board, the surface area of the board and the heat capacity of the board correspond to the data constituting the above-described board physical property data 122.

Figure 2:
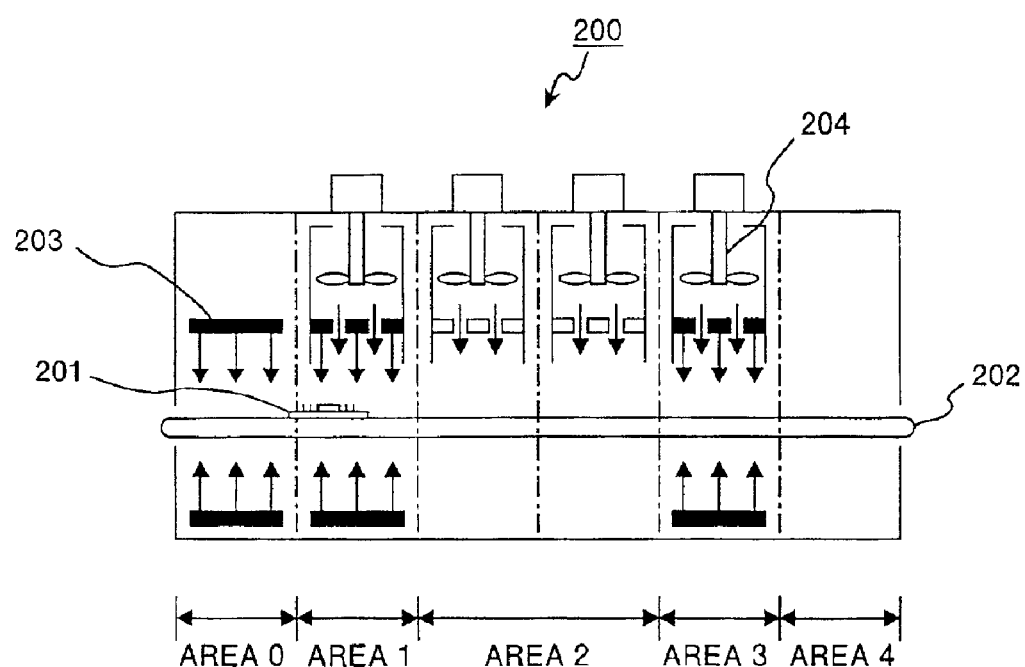
FIG. 2 is a block diagram of a reflow apparatus assumed in the first embodiment.

Moreover, the emissivity of the heater and the heat transfer coefficient of the blower correspond to the data constituting the heating characteristic data 150 of the reflow apparatus described above. FIG. 2 is a block diagram of the reflow apparatus assumed in the first embodiment, and the heating characteristic data 150 of the reflow apparatus includes various data regarding this reflow apparatus.

Figure 11A:
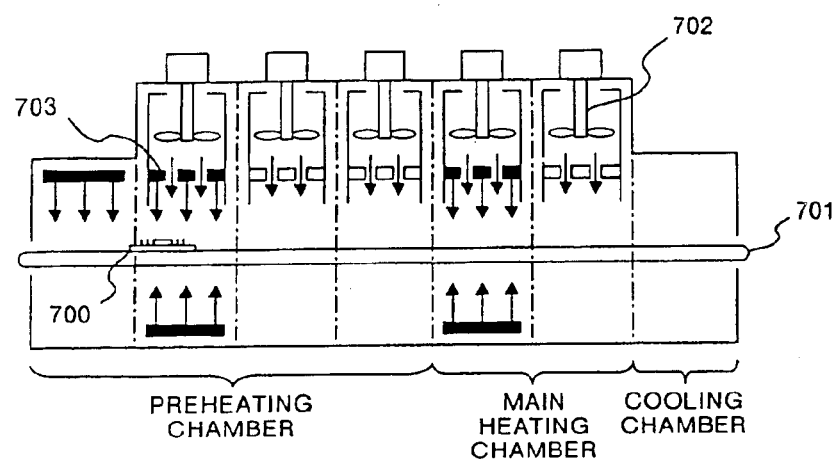
FIG. 11A and FIG. 11B explain the construction of the conventional reflow apparatus and the temperature profile.

The reflow apparatus 200 heats a surface-mounted circuit board 201 carried by a conveyor 202 only with a heater 203 in an area 0, then heats the surface-mounted circuit board 201 with the heater 203 and a blower 204 in an area 1, and then subjects the surface-mounted circuit board 201 to soaking only with the blower 204 in an area 2. These areas 0 to 2 corresponds to the preheating period shown in FIG. 11A, and the surface-mounted circuit board 201 reaches the soaking temperature as shown in FIG. 11B.

Figure 11B:
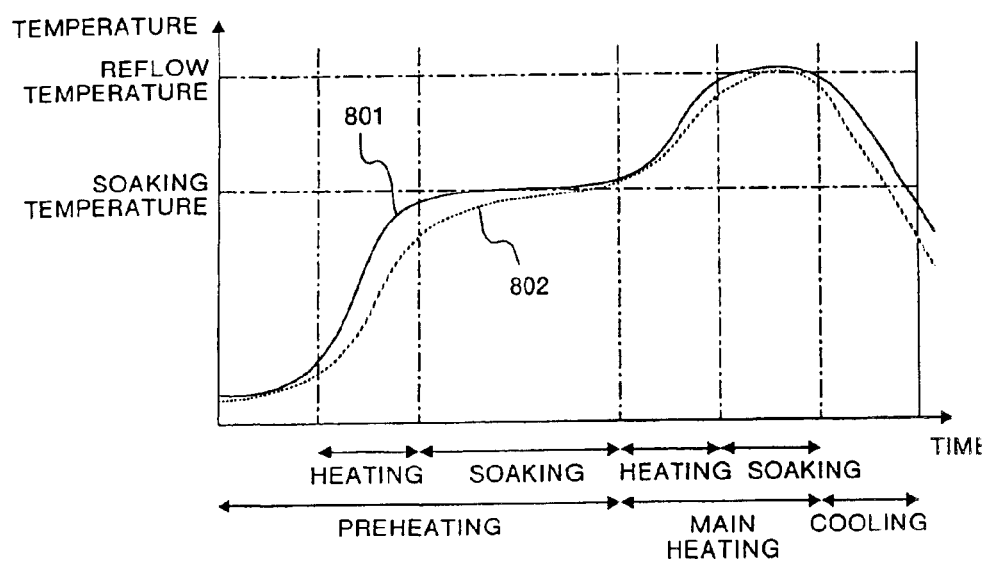

The reflow apparatus 200 then heats the surface-mounted circuit board 201 at a high temperature by using both the heater 203 and the blower 204 in an area 3 corresponding to the main heating chamber, to thereby increase the temperature of the board and the parts constituting the surface-mounted circuit board 201 to the reflow temperature shown in FIG. 11B. Thereafter, the reflow apparatus 200 carries the surface-mounted circuit board 201 to an area 4 for cooling.

Particularly, the heating characteristic data 150 of the reflow apparatus includes the speed of the conveyor 202 shown in FIG. 2, and it can be known after how many seconds the surface-mounted circuit board 201 reaches or goes beyond which area, since having been put into the reflow apparatus 200.

On the other hand, the view factor of the parts with respect to the heater and the view factor of the board with respect to the heater differ depending on which position the parts and the board are located in with respect to the heater. Therefore, the values are determined based on the speed of the conveyor included in the characteristic data 150 of the reflow apparatus and the correspondence data between the position of these objects to be heated with respect to the heater and the view factor. The above-described parts view factor setting data 124 corresponds to the correspondence data between the position of the parts with respect to the heater and the view factor, and the above-described board view factor setting data 125 corresponds to the correspondence data between the position of the board with respect to the heater and the view factor.

Figure 3A:
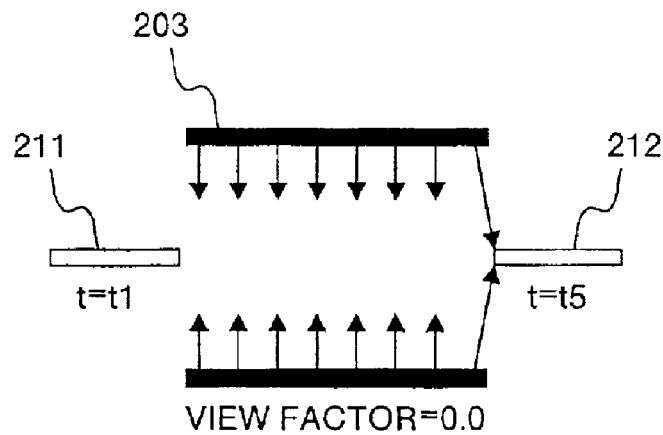
FIG. 3A to FIG. 3C explain one example of correspondence data between the position of a board with respect to a heater and a view factor.
Figure 3B:
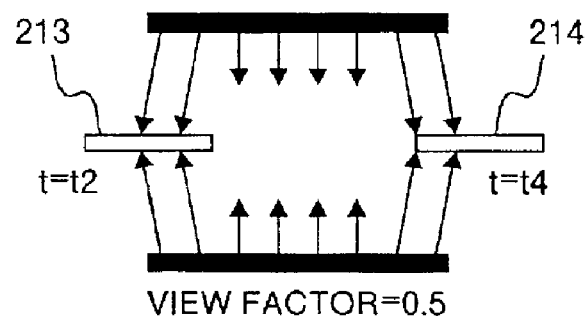
Figure 3C:
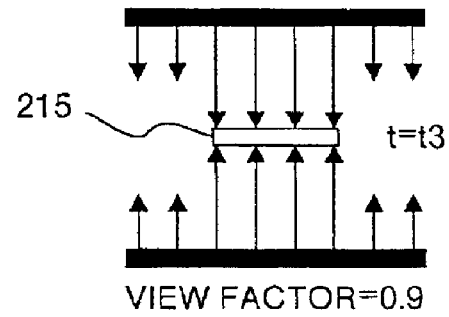

FIG. 3A to FIG. 3C explain one example of the correspondence data between the position of the board with respect to the heater and the view factor. For example, when the length of the board located in the heating area of the heater 203 its less than 25%, for example, at a position 211 or a position 212 shown in FIG. 3A, the view factor is determined as 0. When the length of the board located in the heating area of the heater 203 is from at least 25% to less than 75%, for example, at a position 213 or a position 214 shown in FIG. 3B, the view factor is determined as 0.5. Similarly, when the length of the board located in the heating area of the heater 203 is not less than 75%, as at a position 215 shown in FIG. 3C, the view factor is determined as 0.9. The view factor of the parts can be similarly determined.

Figure 4:
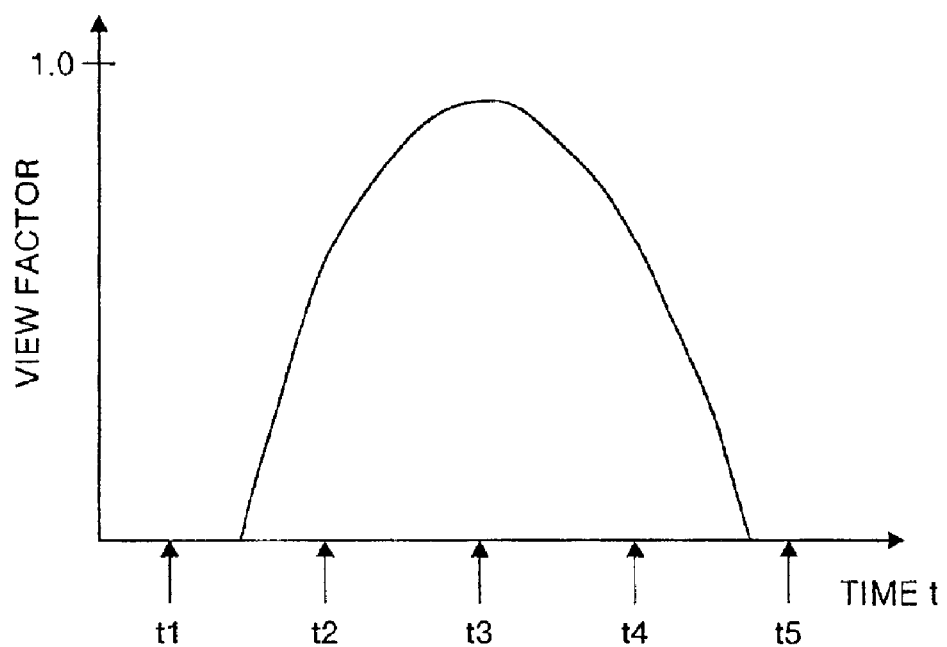
FIG. 4 is a diagram for explaining another example of correspondence data between the position of a board with respect to a heater and a view factor.

FIG. 4 is a diagram for explaining another example of the correspondence data between the position of the board with respect to the heater and the view factor. Since the position of the board with respect to the heater changes due to the transfer by the conveyor 202, the view factor thereof can be determined as a time function, as shown in FIG. 4. In FIG. 4, t1 to t5 correspond to each position of t=t1 to t5 denoted in FIG. 3. The view factor of the parts can be similarly determined.

Figure 5:
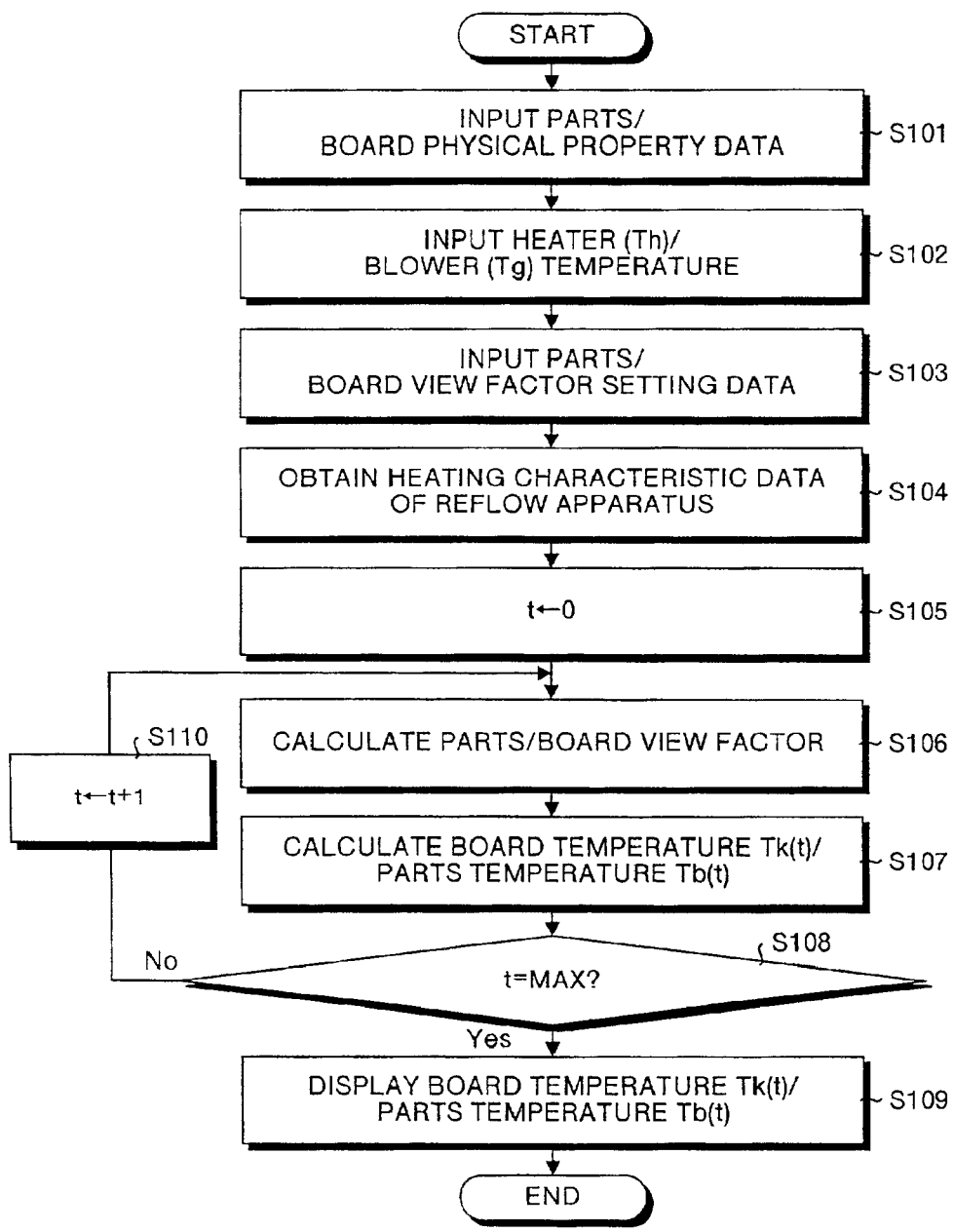
FIG. 5 is a flowchart showing the operation of the thermal analyzer according to the first embodiment.

FIG. 5 is a flowchart showing the operation of the thermal analyzer 100, i.e. the method of thermal analysis. A user inputs the above-described physical property of the parts and physical property of the board by the input section 110 (step S101). In the similar manner, the user inputs the above-described heater/blower temperatures and parts/board view factor setting data (steps S102, S103). Particularly, of these data, the one having different values for each area, as shown in FIG. 2, is input for each area.

In the thermal analyzer 100, the physical property of the parts and the physical property of the board, and the heater/blower temperature is input to the parts/board temperature calculation section 140, and the parts/board view factor setting data is input to the view factor calculation section 130. Also, the parts/board temperature calculation section 140 and the view factor calculation section 130 obtain the heating characteristic data 150 of the reflow apparatus, and calculate the time required since when the surface-mounted circuit board is put into the reflow apparatus till the release thereof, and after how many seconds the surface-mounted circuit board reaches or goes beyond each area as shown in FIG. 2 (step S104).

Then, the time t is initialized (step S105), and the view factor calculation section 130 calculates the view factor of the parts and the board, respectively, determined at time t, based on the view factor setting data as shown in FIG. 4 (step S106). Subsequently, the parts/board temperature calculation section 140 derives the temperature of the parts and the board at time t from the Equation (1), using the view factor calculated by the view factor calculation section 130, the parts physical property data 121, the board physical property data 122, the heater/blower set temperature 123 and the heating characteristic data 150 of the reflow apparatus (step S107).

If the time t does not reach a predetermined maximum value (for example, a time required since when the surface-mounted circuit board is put into the reflow apparatus till the release thereof) (NO in step S108), one second is added to the time t (step S110) and the processing in steps S106 to S108 is repeated again. If the time t reaches the predetermined maximum value (YES in step S108), the display section 170 displays the respective temperatures of the parts and the board as a graph expressing values at the predetermined time and the whole (step S109).

Figure 6:
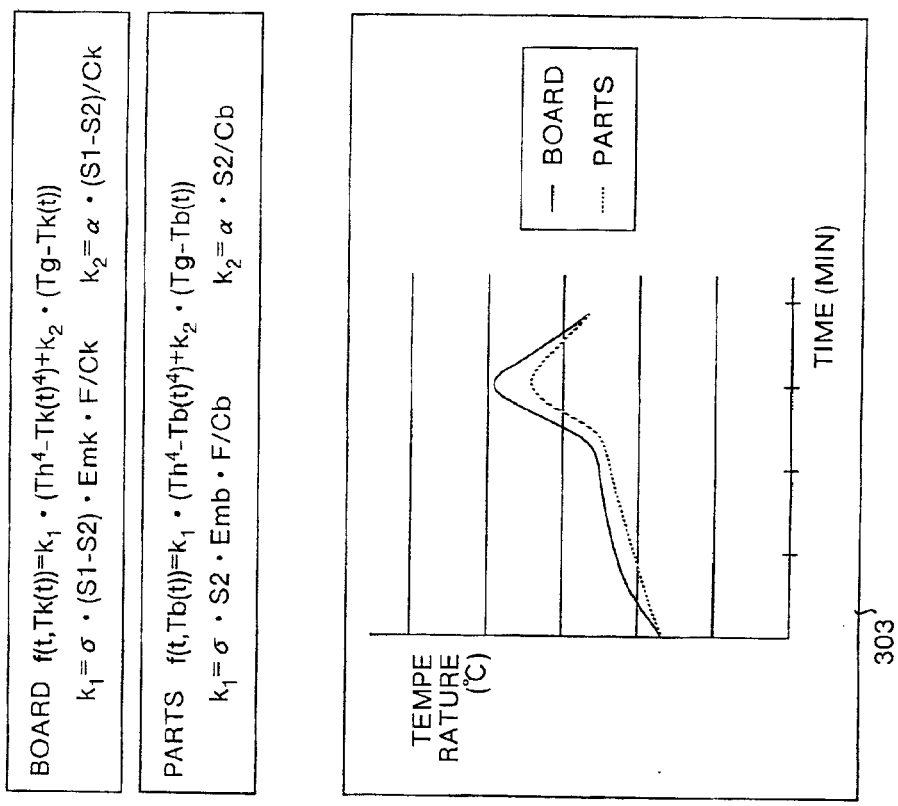
FIG. 6 is a diagram showing a display example of thermal analysis results by means of the thermal analyzer according to the first embodiment.

FIG. 6 is a diagram showing a display example of thermal analysis results. The temperature of the board and the parts after a predetermined period of time are displayed in the analysis result window 302. In the example shown in FIG. 6, after 41 seconds, after 130 seconds, and after 171 seconds correspond respectively to the position going beyond the area 1, area 2 and area 3 shown in FIG. 2. Therefore, for example, it is predicted that the temperature of the parts just after preheating is 125.4° C., and the temperature of the parts just after main heating is 176.1° C. Moreover, as shown in the graph window 303, the temperature profiles of the parts and the board over the areas 0 to 4 shown in FIG. 2 can be displayed.

In FIG. 6, the data input by the input section 110 is also shown in the set value input window 301. Particularly, input of each data in the above steps S101 to S103 can be realized by inputting a numerical value directly in the corresponding part in this set value input window 301. The thermal analyzer 100 can calculate and display the temperature difference between the board and the parts, as shown in the analysis results window 302 in FIG. 6. Since it is preferred that the temperature difference between the board and the parts is small, a user can refer to the displayed temperature difference, at the time of determining the heater temperature and the blower temperature.

As described above, according to the thermal analyzer and the thermal analysis method of the first embodiment, the view factor of the parts and the board with respect to the heater is respectively determined from several choices provided beforehand, or from a graph of time function provided beforehand, based on the transfer speed of the surface-mounted circuit board, and calculates the temperature of the parts and the board by a heat transfer using the view factors. Hence, the complicated input operation of the view factor can be omitted, and the temperature of the parts and the board after a predetermined period of time can be obtained more accurately and more promptly.

Thereby, for example, even if the set temperatures of the heater and the blower are changed, the temperature of the parts and the board can be determined quickly and accurately, compared to the conventional method, and much time is not required for determination of the optimum set temperature, taking into account the heat resistant temperature and the target temperature of the parts and the board, and enabling prompt shift to the actual operation of the heating apparatus such as the reflow apparatus.

The thermal analyzer according to the first embodiment can be replaced with a computer system. In this case, the above-described parts/board temperature calculation section 140 and the view factor calculation section 130 are realized by the logic on the CPU, and the above-described thermal analysis method is realized by a computer program.

The method of and apparatus for calculating thermal conditions according to the second embodiment will now be described. The method of and apparatus for calculating thermal condition according to the second embodiment is characterized by inputting the physical property data regarding a surface-mounted circuit board serving as an object to be heated, view factor setting data for determining a view factor of the surface-mounted circuit board, a target temperature of the surface-mounted circuit board and data for setting an evaluation function, simply determining a view factor from these input physical property data and the view factor setting data, the number of heaters and blowers, and heating characteristic data peculiar to the reflow apparatus involving the heat transfer coefficient thereof and the speed of the conveyor, and calculating the set temperature of the heaters and blowers, so that the temperature of the surface-mounted circuit board becomes the target temperature and satisfies the evaluation function, using the determined view factor.

Figure 7:
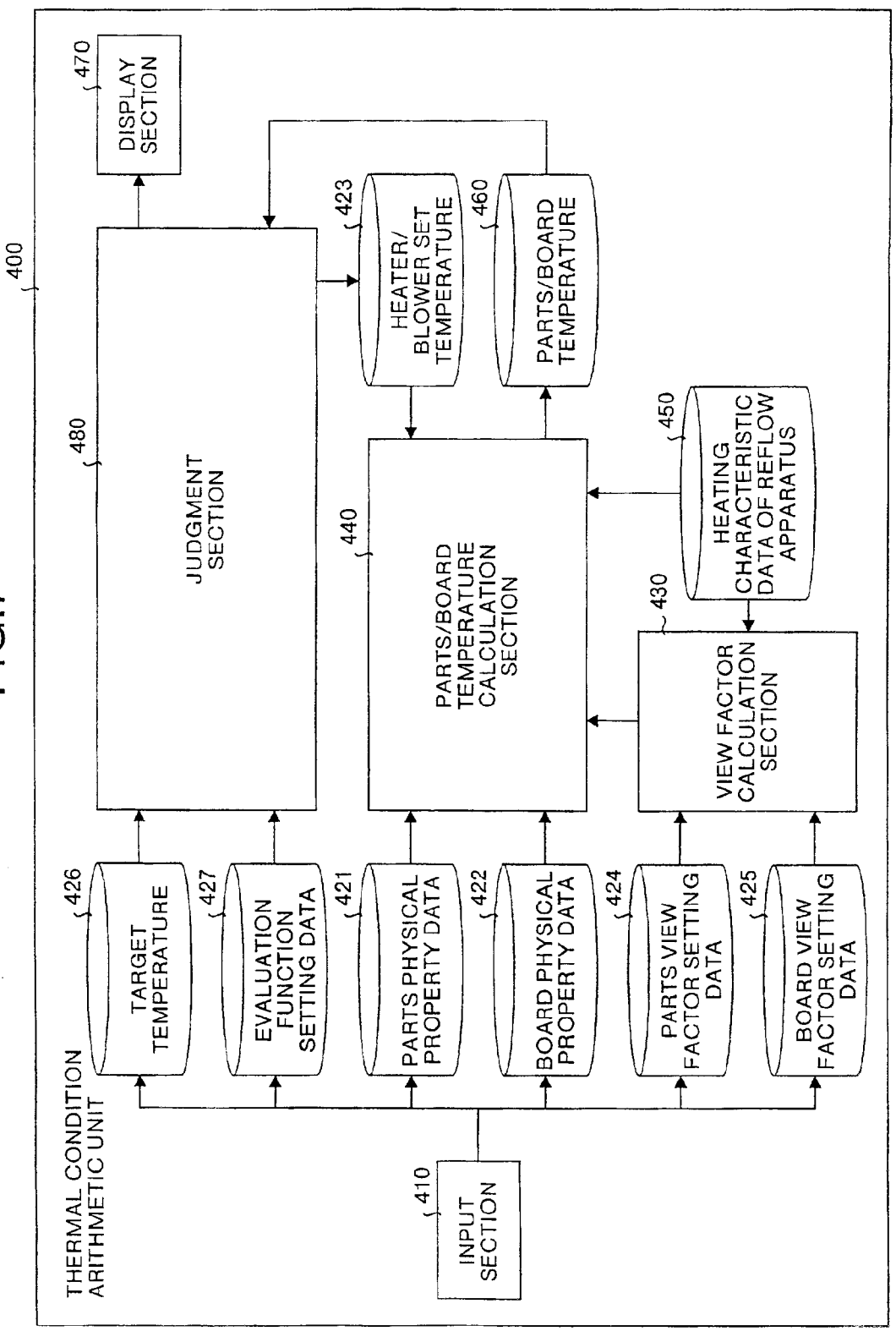
FIG. 7 is a block diagram showing a schematic construction of a thermal conditions calculator according to a second embodiment.

FIG. 7 is a block diagram showing a schematic construction of a thermal conditions calculator according to the second embodiment. This thermal conditions calculator 400 includes the input section 410; a memory section for storing, respectively, the parts physical property data 421, board physical property data 422, parts view factor setting data 424, board view factor setting data 425, target temperature 426, and the evaluation function setting data 427, input using the input section 410. The thermal conditions calculator 400 also includes a memory section for storing the heater/blower set temperature 423 changed according to need by a judgment section 480 described later; a memory section for storing the heating characteristic data 450 of the reflow apparatus; a view factor calculation section 430. The thermal conditions calculator 400 also includes the parts/board temperature calculation section 440; a memory section for storing the parts/board temperature 460; the judgment section 480 for judging whether the results calculated by the parts/board temperature calculation section 440 satisfy the target temperature 426 and the evaluation function or not; and the display section 470 for displaying the input various data and the calculation results of the parts/board temperature calculation section 440.

The input section 410, parts physical property data 421, board physical property data 422, parts view factor setting data 424, board view factor setting data 425, heating characteristic data 450 of the reflow apparatus, view factor calculation section 430, parts/board temperature calculation section 440, parts/board temperature 460, and the display section 470 have respectively the same function or the same contents as the input section 110, parts physical property data 121, board physical property data 122, parts view factor setting data 124, board view factor setting data 125, heating characteristic data 150 of the reflow apparatus, view factor calculation section 130, parts/board temperature calculation section 140, parts/board temperature 160, and display section 170 shown in FIG. 1, and hence the description thereof is omitted here.

Even in the second embodiment, the equation (1) and (2) are used for the calculation of the temperature of the parts and the board in the parts/board temperature calculation section 440, and the calculation of the view factor is performed in the same manner. The construction of the reflow apparatus is the same as shown in FIG. 2.

The target temperature 426 indicates the highest temperature provided to the parts and the board as the reflow temperature, and in FIG. 2, represents a temperature at the time when the surface-mounted circuit board reaches a position at which the surface-mounted circuit board goes beyond the area 3. The evaluation function setting data 427 stands for data for defining an evaluation function used for the judgment in the judgment section 480 of whether the calculation results in the parts/board temperature calculation section 440 are to be adopted or not, and for example, it shows an allowable temperature difference between the board and the parts. In this case, the evaluation function is an expression in which a true value is replaced, when the temperature difference between the board and the parts derived from the calculation results is less than the above-described allowable temperature difference.

Figure 8:
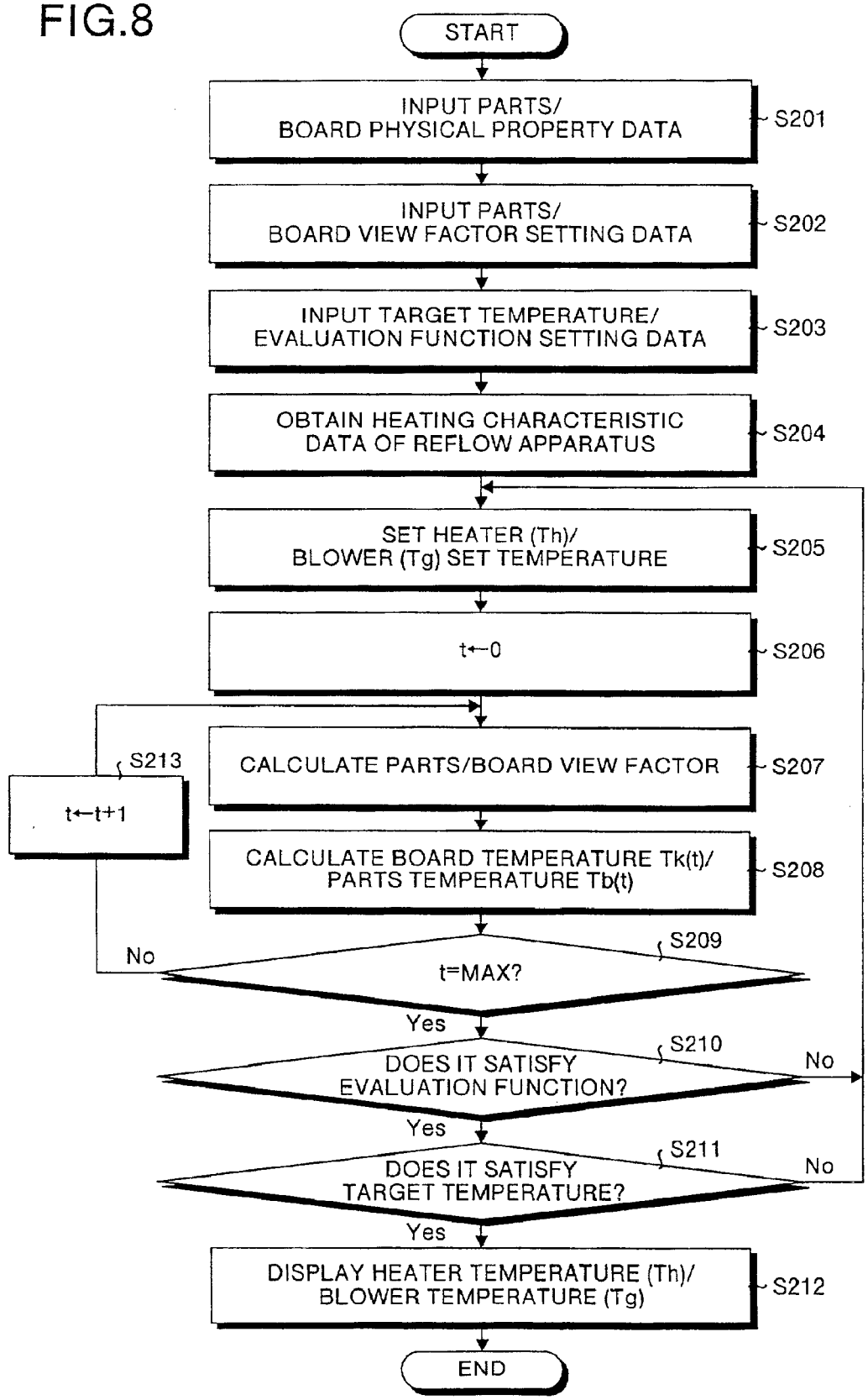
FIG. 8 is a flowchart showing the operation of the thermal conditions calculator according to the second embodiment.

FIG. 8 is a flowchart showing the operation of the thermal conditions calculator 400. i.e. the method of calculating the thermal conditions. The user inputs the above-described physical property of the parts and physical property of the board by the input section 410 (step S201). In the similar manner, the user inputs the above-described parts/board view factor setting data, the target temperature and the evaluation function setting data (steps S202, S203). Particularly, of these data, the one having different values for each area, as shown in FIG. 2, is input for each area.

In the thermal conditions calculator 400, the physical property of the parts and the physical property of the board are input to the parts/board temperature calculation section 440, and the parts/board view factor setting data is input to the view factor calculation section 430. Also, the parts/board temperature calculation section 440 and the view factor calculation section 430 obtain the heating characteristic data 450 of the reflow apparatus, and calculate the time required since when the surface-mounted circuit board is put into the reflow apparatus till the release thereof, and after how many seconds the surface-mounted circuit board reaches or goes beyond each area as shown in FIG. 2 (step S204).

Subsequently, the judgment section 480 sets the set temperature of the heater and the set temperature of the blower to predetermined initial value, respectively (Step S205). Then, the time t is initialized (step S206), and the view factor calculation section 430 calculates the view factor of the parts and the board, respectively, determined at time t, based on the view factor setting data as shown in FIG. 4 (step S207). Subsequently, the parts/board temperature calculation section 440 derives the temperature of the parts and the board at time t from the equation (1), using the view factor calculated by the view factor calculation section 130, the heater/blower set temperature 423 set by the judgment section 480, the parts physical property data 421, the board physical property data 422, and the heating characteristic data 450 of the reflow apparatus (step S208).

If the time t does not reach a predetermined maximum value (for example, a time required since when the surface-mounted circuit board is put into the reflow apparatus till the release thereof) (NO in step S209), one second is added to the time t (step S213) and the processing in steps S207 to S209 is repeated again. If the time t reaches the predetermined maximum value (YES in step S209), the judgment section 480 judges whether the temperature profile Tb(t) of the parts and the temperature profile Tk(t) of the board calculated by the parts/board temperature calculation section 440 over t=0 to MAX are adopted or not.

This judgment is performed depending on whether the temperature profile Tb(t) of the parts and the temperature profile Tk(t) of the board satisfy the evaluation function or not (step S210). For example, when a function for judging whether the temperature difference between the board and the parts is not larger than the allowable value or not is used as the evaluation function, the judgment section 480 calculates the maximum value of the difference between these temperatures at the same moment in the temperature profile Tb(t) of the parts and the temperature profile Tk(t) of the board, and when the calculated value is not larger than the above-described allowable value, judges that the evaluation function is satisfied.

As the evaluation function, other than the function for evaluating the above-described temperature difference between the board and the parts, there can be used a function for evaluating whether the maximum value of the temperature profile Tb(t) of the parts and the temperature profile Tk(t) of the board respectively exceed a predetermined allowable temperature or not.

When the judgment section 480 judges that the calculated temperature profile Tb(t) of the parts and temperature profile Tk(t) of the board exceed the evaluation function, the judgment section 480 judges whether the terminal temperature of the temperature profile Tb(t) of the parts and that of the temperature profile Tk(t) of the board (here, a temperature at a point going beyond the area 3 shown in FIG. 2, and represents a reflow temperature) satisfy the target temperature 426 or not (step S211). When the judgment section 480 judges that the terminal temperature of the temperature profile Tb(t) of the parts and that of the temperature profile Tk(t) of the board satisfy the target temperature 426, the display section 170 displays a graph showing respective temperatures at a predetermined time, of the temperature profile Tb(t) of the parts and the temperature profile Tk(t) of the board, and the whole profiles, and also displays the set temperature of the heater and the blower set for obtaining these profiles (step S212)

On the other hand, when it is judged in step S210 that the evaluation function is not satisfied, and when it is judged in step S211 that the target temperature is not satisfied, the judgment section 480 returns to step S205, to set the set temperature of the heater and the blower to a value different from the previous value, respectively, and repeats the processing in steps S207 to S211 and S213 again.

Therefore, the temperature profile Tb(t) of the parts and the temperature profile Tk(t) of the board, which satisfy the evaluation function and the target temperature, can be finally obtained, and the set temperature of the heater and the blower for obtaining these profiles can be presented.

In the above description, the thermal conditions calculator 400 displays the temperature profile of the parts and the board and the set temperature of the heater and the blower, at the time when the temperature profile Tb(t) of the parts and the temperature profile Tk(t) of the board first satisfy the evaluation function and the target temperature. However, it can be considered that there are various combinations of the set temperatures of the heater and the blower wherein the temperature profile Tb(t) of the parts and the temperature profile Tk(t) of the board satisfy the evaluation function and the target temperature at the same time.

Therefore, when a function for judging whether the temperature difference between the board and the parts is not higher than a predetermined allowable temperature or not is designated as the evaluation function, a second evaluation function for selecting a profile in which the temperature difference between the board and the plates becomes the minimum may be introduced, of a plurality of combinations of the temperature profile Tb(t) of the parts and the temperature profile Tk(t) of the board satisfying the evaluation function and the target temperature. Hence, in this case, there are displayed the temperature profile Tb(t) of the parts and the temperature profile Tk(t) of the board satisfying the target temperature, in which the temperature difference between the board and the parts becomes the minimum, and the set temperature of the heater and the blower for obtaining these profiles.

Similarly, when a function for evaluating whether the highest values of the temperature profile Tb(t) of the parts and the temperature profile Tk(t) of the board respectively exceed a predetermined allowable temperature or not is designated as the evaluation function, a second evaluation function for selecting a profile in which the temperature difference from the predetermined allowable temperature, or an integral value of the n-th power (n>0) of the temperature becomes the minimum difference in each of the board and the plates can be introduced.

Figure 9:
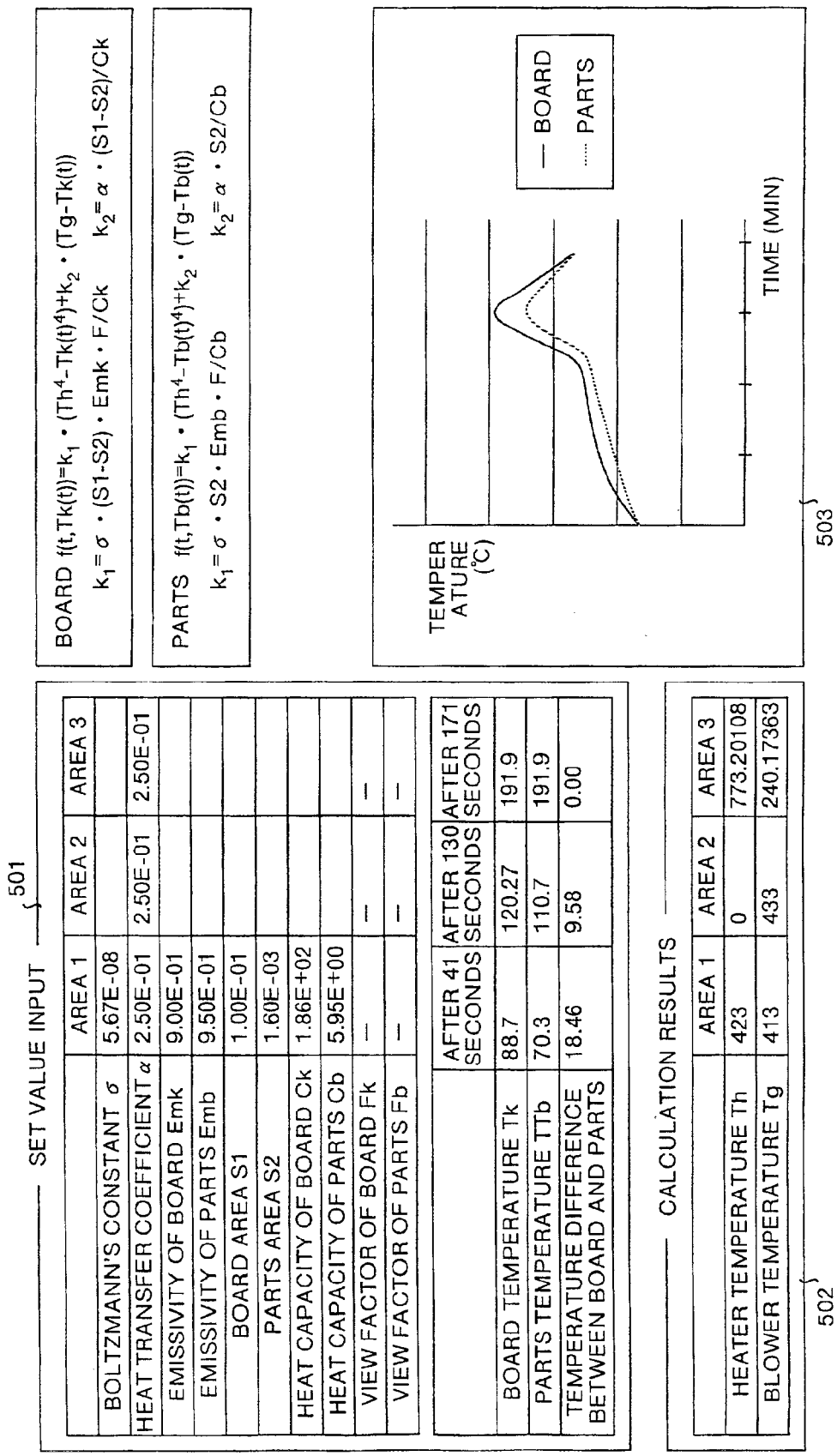
FIG. 9 is a diagram showing a display example of calculation results of the heater/blower set temperature by means of the thermal conditions calculator according to the second embodiment.

FIG. 9 is a diagram showing a display example of calculation results of the heater/blower set temperature. The set temperature of the heater and the blower is shown in the calculation results window 502. The data input by the input section 410 is also shown in the set value input window 501. Particularly, input of each data in the above steps S201 to S203 can be realized by inputting a numerical value directly in the corresponding part in this set value input window 501.

Particularly, in the example shown in FIG. 9, after 41 seconds, after 130 seconds, and after 171 seconds correspond respectively to the position going beyond the area 1, area 2 and area 3 shown in FIG. 2. Therefore, for example, the input box for the board temperature after 171 seconds in the set value input window 501 may be designated as an input box for the target temperature 426. The input box for the temperature difference between the board and the parts after 171 seconds in the set value input window 501 may be also designated as an input box for the evaluation function setting data. Moreover, as shown in the graph window 503, the temperature profile of the parts and the board may be displayed.

As described above, according to the method of and apparatus for calculating thermal conditions of the second embodiment, as shown in the first embodiment, the view factor of the parts and the board with respect to the heater is simply introduced, so that the temperature of the parts and the board after a predetermined period of time can be obtained accurately and quickly, and the set temperature of the heater and the blower is calculated so that the temperature profile of the parts and the board satisfies, respectively, the target temperature and the predetermined evaluation function at the same time. Therefore, the user is relieved of complicated processing such as finding whether these set temperatures are adequate or not from the results obtained by properly changing the set temperature of the heater and the blower, and can obtain thermal conditions set to the reflow apparatus more optimally and more promptly.

The thermal conditions calculator according to the second embodiment may be incorporated as a partial constituent of the reflow apparatus. FIG. 10 is a block diagram showing a schematic construction of the reflow apparatus incorporating the thermal conditions calculator according to the second embodiment. The reflow apparatus 600 inputs the set temperature of the heater and the blower calculated by the thermal conditions calculator 400 in the control section 610, and the control section 610 controls the heater 620 and the blower 630 based on the input set temperature of the heater and the blower, respectively.

The thermal conditions calculator according to the second embodiment described above may be replaced with a computer system. In this case, the above-described parts/board temperature calculation section 440, view factor calculation section 430 and judgment section 480 are realized by the logic on the CPU, and the above-described thermal condition calculation method is realized by a computer program.

As described above, according to the method of and apparatus for thermal analysis of the present invention, a view factor of an object to be heated is determined from the view factor setting data indicating the correspondence between the position of the object to be heated with respect to the heating sources, and calculates the temperature of the object to be heated by a heat transfer using the view factor. Therefore, complicated input operation of the view factor can be omitted, and an effect can be obtained that the temperature of the object to be heated after a predetermined period of time can be obtained accurately and promptly.

Moreover, according to the method of and apparatus for calculating thermal conditions of the present invention, a view factor of an object to be heated with respect to the heating sources is simply introduced, so that the temperature of the object to be heated after a predetermined period of time can be obtained accurately and quickly, and thermal conditions such as the set temperature of the heating sources is calculated so that the temperature profile of the object to be heated satisfies the predetermined evaluation function. Therefore, the user is relieved of complicated processing such as finding whether these thermal conditions are adequate or not from the results obtained by properly changing the thermal conditions, and can obtain thermal conditions set to the heating furnace can be obtained more optimally and more promptly.

Furthermore, according to the program of the present invention, there can be obtained an effect that the above-described thermal analysis method and the thermal condition calculation method can be realized on the computer.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A thermal analyzer for predicting a temperature of an object to be heated, when a heating furnace heats said object based on predetermined heating conditions, said thermal analyzer comprising:

an input unit for inputting at least the heating conditions, the physical property data of said object and the view factor setting data of said object;

a view factor calculation unit which calculates a view factor corresponding to a position of said object with respect to heating sources, based on the heating characteristic data of the heating furnace including data regarding at least the number and arrangement of said heating sources of said heating furnace, and the view factor setting data; and a temperature calculation unit which calculates the temperature of said object, based on the heating conditions, the physical property data of said object, the heating characteristic data of said heating furnace and the view factor.

2. A thermal conditions calculator for deriving predetermined heating conditions so that the temperature of an object to be heated satisfies desired conditions when a heating furnace heats said object based on the predetermined heating conditions, said thermal conditions calculator comprising:

an input unit for inputting the desired conditions of heating characteristic data, heating characteristic data of said object and an evaluation function;

a temperature calculation unit which calculates the temperature of said object, based on the heating characteristic data and the heating characteristic data of said object; and a judgment unit which judges whether the evaluation function satisfies predetermined conditions or not, with respect to the temperature calculated by said temperature calculation unit, wherein if said judgment unit judges that the evaluation function does not satisfy the predetermined conditions it changes the heating conditions, and if said judgment unit judges that the evaluation function satisfies the predetermined conditions it outputs the heating conditions set at the time of calculation of the temperature; and when the heating conditions are changed by said judgment unit, said temperature calculation unit calculates the temperature of said object again, based on the changed heating conditions.

3. A thermal conditions calculator for deriving predetermined heating conditions so that the temperature of an object to be heated comprising a plurality of constituents satisfies desired conditions when a heating furnace heats said object based on the predetermined heating conditions, said thermal conditions calculator comprising:

an input unit for inputting at least an evaluation function that satisfies conditions when a temperature difference between the plurality of constituents becomes a predetermined value or below, the heating conditions and the physical property data of said object;

a temperature calculation unit which calculates the temperature of said object, based on heating characteristic data of the heating furnace including data regarding at least the number and arrangement of heating sources of said heating furnace, the heating conditions and the physical property of said object; and a judgment unit which judges whether the temperature calculated by said temperature calculation unit satisfies the evaluation function or not, wherein if said judgment unit judges that the temperature does not satisfy the evaluation function it changes the heating conditions, and if said judgment unit judges that the temperature satisfies the evaluation function it outputs the heating conditions set at the time of calculation of the temperature; and when the heating conditions are changed by said judgment unit, said temperature calculation unit calculates the temperature of said object again, based on the changed heating conditions.

4. The thermal conditions calculator according to claim 3, further comprising a second judgment unit which specifies a temperature at which a temperature difference between the plurality of constituents becomes minimum, of the temperatures judged as satisfying the evaluation function in said judgment unit, and outputs the heating conditions set at the time of calculation of the specified temperature.

5. A thermal conditions calculator for deriving predetermined heating conditions so that the temperature of an object to be heated satisfies desired conditions when a heating furnace heats said object based on the predetermined heating conditions, said thermal conditions calculator comprising:

an input unit for inputting at least an evaluation function that satisfies conditions when the temperature of said object becomes a predetermined allowable temperature or below, the heating conditions and the physical property data of said object;

a temperature calculation unit which calculates the temperature of said object, based on heating characteristic data of the heating furnace including data regarding at least the number and arrangement of heating sources of said heating furnace, the heating conditions and the physical property of said object; and a judgment unit which judges whether the temperature calculated by said temperature calculation unit satisfies the evaluation function or not, wherein if said judgment unit judges that the temperature does not satisfy the evaluation function it changes the heating conditions, and if said judgment unit judges that the temperature satisfies the evaluation function it outputs heating conditions set at the time of calculation of the temperature; and when the heating conditions are changed by said judgment unit, said temperature calculation unit calculates the temperature of said object again, based on the changed heating conditions.

6. The thermal conditions calculator according to claim 5, further comprising a second judgment unit which specifies a temperature at which a difference between the temperature of said object and said allowable temperature, or an integral value of the n-th power of said difference (n>0) becomes minimum, of the temperatures judged as satisfying the evaluation function in said judgment unit, and outputs the heating conditions set at the time of calculation of the specified temperature.

7. A method of thermal analysis of predicting a temperature of an object to be heated, when a heating furnace heats said object based on predetermined heating conditions, the method comprising the steps of:

inputting at least the heating conditions, the physical property data of said object and the view factor setting data of said object;

calculating a view factor corresponding to a position of said object with respect to heating sources, based on the heating characteristic data of the heating furnace including data regarding at least the number and arrangement of said heating sources of said heating furnace, and the view factor setting data; and calculating the temperature of said object, based on the heating conditions, the physical property of said object, the heating characteristic data of said heating furnace and the view factor.

8. A method of calculating thermal conditions of deriving predetermined heating conditions so that the temperature of an object to be heated satisfies desired conditions when a heating furnace heats said object based on the predetermined heating conditions, the method comprising the steps of:

inputting at least an evaluation function indicating the desired conditions, the heating conditions, the physical property data of said object and the view factor setting data of said object;

calculating a view factor corresponding to a position of said object with respect to heating sources, based on the heating characteristic data of the heating furnace including data regarding at least the number and arrangement of said heating sources of said heating furnace, and the view factor setting data;

calculating the temperature of said object, based on the heating conditions, the physical property of said object, the heating characteristic data of said heating furnace and the view factor; and judging whether the calculated temperature satisfies the evaluation function or not, and changing the heating conditions if it is judged that the temperature does not satisfy the evaluation function, and outputting the heating conditions set at the time of calculation of the temperature if it is judged that the temperature satisfies the evaluation function, wherein the calculation of temperature and the judgment of whether the calculated temperature satisfies the evaluation function or not are repeated, when the heating conditions are changed, again based on the changed heating conditions.

9. A method of calculating thermal conditions of deriving predetermined heating conditions so that the temperature of an object to be heated comprising a plurality of constituents satisfies desired conditions when a heating furnace heats said object based on the predetermined heating conditions, the method comprising the steps of:

inputting at least an evaluation function that satisfies conditions when a temperature difference between said pluralities of constituents becomes a predetermined value or below, the heating conditions and the physical property data of said object;

calculating the temperature of said object, based on heating characteristic data of the heating furnace including data regarding at least the number and arrangement of heating sources of said heating furnace, the heating conditions and the physical property of said object; and judging whether the temperature calculated in said temperature calculation step satisfies the evaluation function or not, and changing the heating conditions if it is judged that the temperature does not satisfy the evaluation function, and outputting the heating conditions set at the time of calculation of the temperature if it is judged that the temperature satisfies the evaluation function, wherein the calculation of temperature and the judgment of whether the calculated temperature satisfies the evaluation function or not are repeated, when the heating conditions are changed, again based on the changed heating conditions.

10. The method of calculating thermal conditions according to claim 9, further comprising a second judgment step of specifying a temperature at which a temperature difference between the plurality of constituents becomes minimum, of the temperatures judged as satisfying the evaluation function in said judgment step, and outputting the heating conditions set at the time of calculation of the specified temperature.

11. A method of calculating thermal conditions of deriving predetermined heating conditions so that the temperature of an object to be heated satisfies desired conditions when a heating furnace heats said object based on the predetermined heating conditions, the method comprising the steps of:

inputting at least an evaluation function that satisfies conditions when the temperature of said object becomes a predetermined allowable temperature or below, the heating conditions and the physical property data of said object;

calculating the temperature of said object, based on the heating characteristic data of the heating furnace including data regarding at least the number and arrangement of heating sources of said heating furnace, the heating conditions and the physical property of said object; and judging whether the temperature calculated in said temperature calculation step satisfies the evaluation function or not, and changing the heating conditions if it is judged that the temperature does not satisfy the evaluation function, and outputting the heating conditions set at the time of calculation of the temperature if it is judged that the temperature satisfies the evaluation function, wherein the calculation of temperature and the judgment of whether the calculated temperature satisfies the evaluation function or not are repeated, when the heating conditions are changed, again based on the changed heating conditions.

12. The method of calculating thermal conditions according to claim 11, further comprising a second judgment step of specifying a temperature at which a difference between the temperature of said object and said allowable temperature, or an integral value of the n-th power of said difference (n>0) becomes minimum, of the temperature judged as satisfying the evaluation function in said judgment step, and outputting the heating conditions set at the time of calculation of the specified temperature.

13. A computer program which when executed on a computer realizes a method of thermal analysis of predicting a temperature of an object to be heated, when a heating furnace heats said object based on predetermined heating conditions, the computer program making the computer execute the steps of:

inputting at least the heating conditions, the physical property data of said object and the view factor setting data of said object;

calculating a view factor corresponding to a position of said object with respect to heating sources, based on the heating characteristic data of the heating furnace including data regarding at least the number and arrangement of said heating sources of said heating furnace, and the view factor setting data; and calculating the temperature of said object, based on the heating conditions, the physical property of said object, the heating characteristic data of said heating furnace and the view factor.

14. A computer program which when executed on a computer realizes method of calculating thermal conditions of deriving predetermined heating conditions so that the temperature of an object to be heated satisfies desired conditions when a heating furnace heats the object based on the predetermined heating conditions, the computer program making the computer execute the steps of:

inputting at least an evaluation function indicating the desired conditions, the heating conditions, the physical property data of said object and the view factor setting data of said object;

calculating a view factor corresponding to a position of said object with respect to heating sources, based on the heating characteristic data of the heating furnace including data regarding at least the number and arrangement of said heating sources of said heating furnace, and the view factor setting data;

calculating the temperature of said object, based on the heating conditions, the physical property of said object, the heating characteristic data of said heating furnace and the view factor; and judging whether the calculated temperature satisfies the evaluation function or not, and changing the heating conditions if it is judged that the temperature does not satisfy the evaluation function, and outputting the heating conditions set at the time of calculation of the temperature if it is judged that the temperature satisfies the evaluation function, wherein the calculation of temperature and the judgment of whether the calculated temperature satisfies the evaluation function or not are repeated, when the heating conditions are changed, again based on the changed heating conditions.

15. A computer program which when executed on a computer realizes method of calculating thermal conditions of deriving predetermined heating conditions so that the temperature of an object to be heated comprising a plurality of constituents satisfies desired conditions when a heating furnace heats the object based on the predetermined heating conditions, the computer program making the computer execute the steps of:

inputting at least an evaluation function that satisfies conditions when a temperature difference between said pluralities of constituents becomes a predetermined value or below, the heating conditions and the physical property data of said object;

calculating the temperature of said object, based on heating characteristic data of the heating furnace including data regarding at least the number and arrangement of heating sources of said heating furnace, the heating conditions and the physical property of said object; and judging whether the temperature calculated in said temperature calculation step satisfies the evaluation function or not, and changing the heating conditions if it is judged that the temperature does not satisfy the evaluation function, and outputting the heating conditions set at the time of calculation of the temperature if it is judged that the temperature satisfies the evaluation function, wherein the calculation of temperature and the judgment of whether the calculated temperature satisfies the evaluation function or not are repeated, when the heating conditions are changed, again based on the changed heating conditions.

16. The computer program according to claim 15, further making the computer execute a second judgment step of specifying a temperature at which a temperature difference between the plurality of constituents becomes minimum, of the temperatures judged as satisfying the evaluation function in said judgment step, and outputting the heating conditions set at the time of calculation of the specified temperature.

17. A computer program which when executed on a computer realizes method of calculating thermal conditions of deriving predetermined heating conditions so that the temperature of an object to be heated satisfies desired conditions when a heating furnace heats the object based on the predetermined heating conditions, the computer program making the computer execute the steps of:

inputting at least an evaluation function that satisfies conditions when the temperature of said object becomes a predetermined allowable temperature or below, the heating conditions and the physical property data of said object;

calculating the temperature of said object, based on the heating characteristic data of the heating furnace including data regarding at least the number and arrangement of heating sources of said heating furnace, the heating conditions and the physical property of said object; and judging whether the temperature calculated in said temperature calculation step satisfies the evaluation function or not, and changing the heating conditions if it is judged that the temperature does not satisfy the evaluation function, and outputting the heating conditions set at the time of calculation of the temperature if it is judged that the temperature satisfies the evaluation function, wherein the calculation of temperature and the judgment of whether the calculated temperature satisfies the evaluation function or not are repeated, when the heating conditions are changed, again based on the changed heating conditions.

18. The computer program according to claim 17, further making the computer execute a second judgment step of specifying a temperature at which a difference between the temperature of said object and said allowable temperature, or an integral value of the n-th power of said difference (n>0) becomes minimum, of the temperature judged as satisfying the evaluation function in said judgment step, and outputting the heating conditions set at the time of calculation of the specified temperature.

* * * * *